United States Patent
Bogenberger et al.

(10) Patent No.: US 8,793,700 B2
(45) Date of Patent: Jul. 29, 2014

(54) SYNCHRONIZATION OF STATEFUL ELEMENTS IN A PROCESSING RESOURCE USING A SCAN CHAIN

(75) Inventors: Florian Bogenberger, Poing (DE); Anthony Reipold, Austin, TX (US); Oleksandr Sakada, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 737 days.

(21) Appl. No.: 12/937,891

(22) PCT Filed: May 14, 2008

(86) PCT No.: PCT/IB2008/051891
§ 371 (c)(1),
(2), (4) Date: Oct. 14, 2010

(87) PCT Pub. No.: WO2009/138819
PCT Pub. Date: Nov. 19, 2009

(65) Prior Publication Data
US 2011/0035750 A1    Feb. 10, 2011

(51) Int. Cl.
G06F 9/46     (2006.01)
G06F 11/00    (2006.01)

(52) U.S. Cl.
USPC .......................................... 718/108; 714/12

(58) Field of Classification Search
None
See application file for complete search history.

(56) References Cited

U.S. PATENT DOCUMENTS

| | | | |
|---|---|---|---|
| 5,202,625 A * | 4/1993 | Farwell | 714/727 |
| 5,758,058 A | 5/1998 | Milburn | |
| 6,044,025 A * | 3/2000 | Lawman | 365/191 |
| 6,374,380 B1 * | 4/2002 | Sim | 714/727 |
| 6,446,229 B1 * | 9/2002 | Merrick et al. | 714/724 |
| 6,731,140 B2 * | 5/2004 | Masleid et al. | 327/99 |
| 6,901,544 B1 * | 5/2005 | Huth et al. | 714/731 |
| 7,111,196 B2 * | 9/2006 | Balazich et al. | 714/13 |
| 2005/0034017 A1 | 2/2005 | Airaud et al. | |
| 2007/0174687 A1 | 7/2007 | Graham et al. | |
| 2008/0023700 A1 | 1/2008 | Gschwind | |

FOREIGN PATENT DOCUMENTS

| | | |
|---|---|---|
| EP | 0372580 A | 6/1990 |
| GB | 2430779 A | 4/2007 |

OTHER PUBLICATIONS

International Search Report and Written Opinion correlating to PCT/IB2008/051891 dated Feb. 2, 2009.

* cited by examiner

Primary Examiner — Meng An
Assistant Examiner — Wissam Rashid

(57) ABSTRACT

A processing resource apparatus comprises a reference processing module comprising a set of reference stateful elements and a target processing module comprising a set of target stateful elements. A scan chain having a first mode for supporting manufacture testing is also provided, the scan chain being arranged to couple the reference processing module to the target processing module. The scan chain also has a second mode capable of synchronizing the set of target stateful elements with the set of reference stateful elements in response to a synchronization signal.

12 Claims, 7 Drawing Sheets

SYNCHRONIZATION OF STATEFUL ELEMENTS IN A PROCESSING RESOURCE USING A SCAN CHAIN

FIELD OF THE INVENTION

This invention relates to a processing resource apparatus of the type that, for example, may comprise a reference processing module and a target processing module that can be synchronised with the reference processing module. This invention also relates to a method of synchronising a processing resource of the type that, for example, may comprise synchronisation of a target processing module with a reference processing module.

BACKGROUND OF THE INVENTION

In the field of microprocessor architecture, it is known to provide so-called "multi-core" devices. As the name suggests, a multi-core device comprises a number of processor cores, for example two cores. Microprocessors with multiple cores provide a number of benefits. One known benefit is an increase in performance by the additional capacity provided by an additional processor, resulting in a pair of processors operating in an asynchronous manner so that a greater processing workload can be undertaken as compared with a single-core processing device.

Another benefit of multi-core devices, when operating in a synchronous manner, is increased redundancy that can be used to support so-called mission-critical applications, where a backup core is required in order to protect against situations when a primary core can fail. Furthermore, it is becoming desirable to make the multi-core devices switchable between the synchronous and asynchronous modes.

In order to switch between an asynchronous mode and a synchronous mode, a synchronisation step needs to be performed in order to change the states of the processing cores so that the states of the two cores are identical. To achieve synchronisation, the state of a first core has to be copied to a second, redundant, core. In this respect, the first core comprises static Random Access Memory (RAM) and flip-flops, the data stored in the static RAM and the states of the flip flops characterising the state of the first core.

Replication of the contents of the static RAM is a relatively straightforward task. However, copying the states of the flip-flops is not as easy as in respect of the static RAM. Additionally, the number of flip-flops of the first and second cores can be quite large, for example more than 6500 flip-flops each. Consequently, significant additional software or dedicated hardware has to be provided in order to copy the respective states of a first number of flip-flops of the first core to a second set of flip-flops of the second core. Moreover, use of software to copy the states of the flip-flops disadvantageously typically requires at least two thousand, and possibly several thousand, processor cycles. Furthermore, to achieve such synchronisation, the first and second cores have to be reset and software executed to run both cores in a so-called "lock-step" manner. This technique therefore reduces system availability for the performance of critical functions.

SUMMARY OF THE INVENTION

The present invention provides a processing resource apparatus as set forth in the accompanying claims. The present invention also provides a method of synchronising a processing reosurce as set forth in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

In the foregoing description, the invention has been described with reference to specific examples of embodiments of the invention. It will, however, be evident that various modifications and changes may be made therein without departing from the broader spirit and scope of the invention as set forth in the appended claims. For example, connections may be any type of connection suitable to transfer signals from or to the respective nodes, units or devices, for example via intermediate devices. Accordingly, unless implied or stated otherwise the connections may for example be direct connections or indirect connections.

The semiconductor device described herein can be formed from any suitable semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Figure 1:
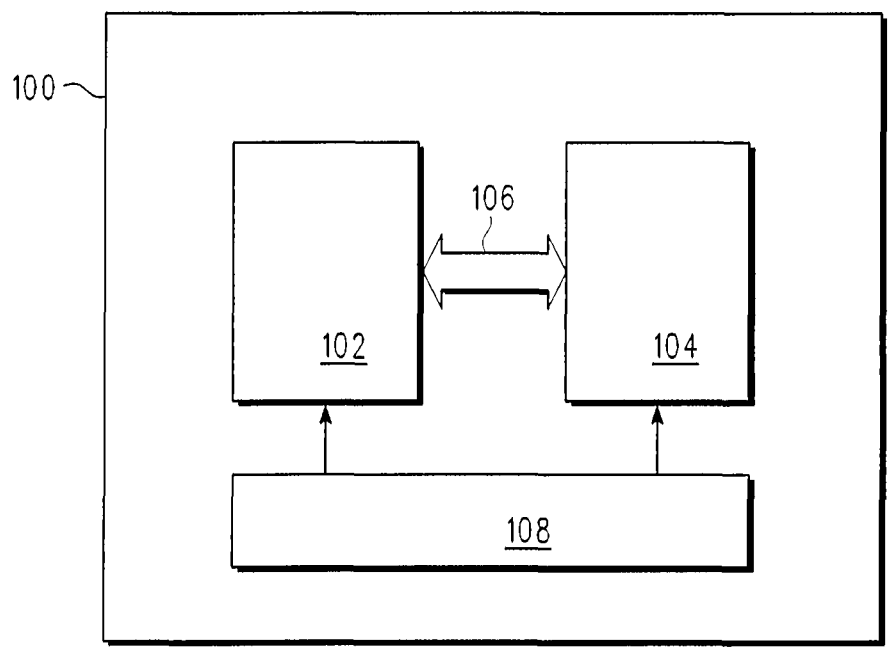
FIG. 1 is a schematic diagram of an integrated circuit, in overview, employing an example of an apparatus for supporting an embodiment of the invention.

Referring to FIG. 1, an integrated circuit 100, for example a microprocessor constituting a processing resource, may comprise a reference processing module 102, for example a first processor core, and a target module 104, for example a second processor core. A scan chain arrangement may comprise interconnections 106 between the reference module 102 and the target processing module 104. The scan chain arrangement may also comprise control logic 108. Although the first processor core and the second processor core have been provided as examples of the reference processing module 102 and the target processing module 104, the skilled person should appreciate that the reference processing module 102 and the second processing module 104 can each be any suitable processing capability that needs to be capable of synchronisation. Indeed, the architectures of the reference and target processing modules 102, 104 need not be identical as long as the reference and target processing modules 102, 104 are capable of synchronisation.

Figure 2:
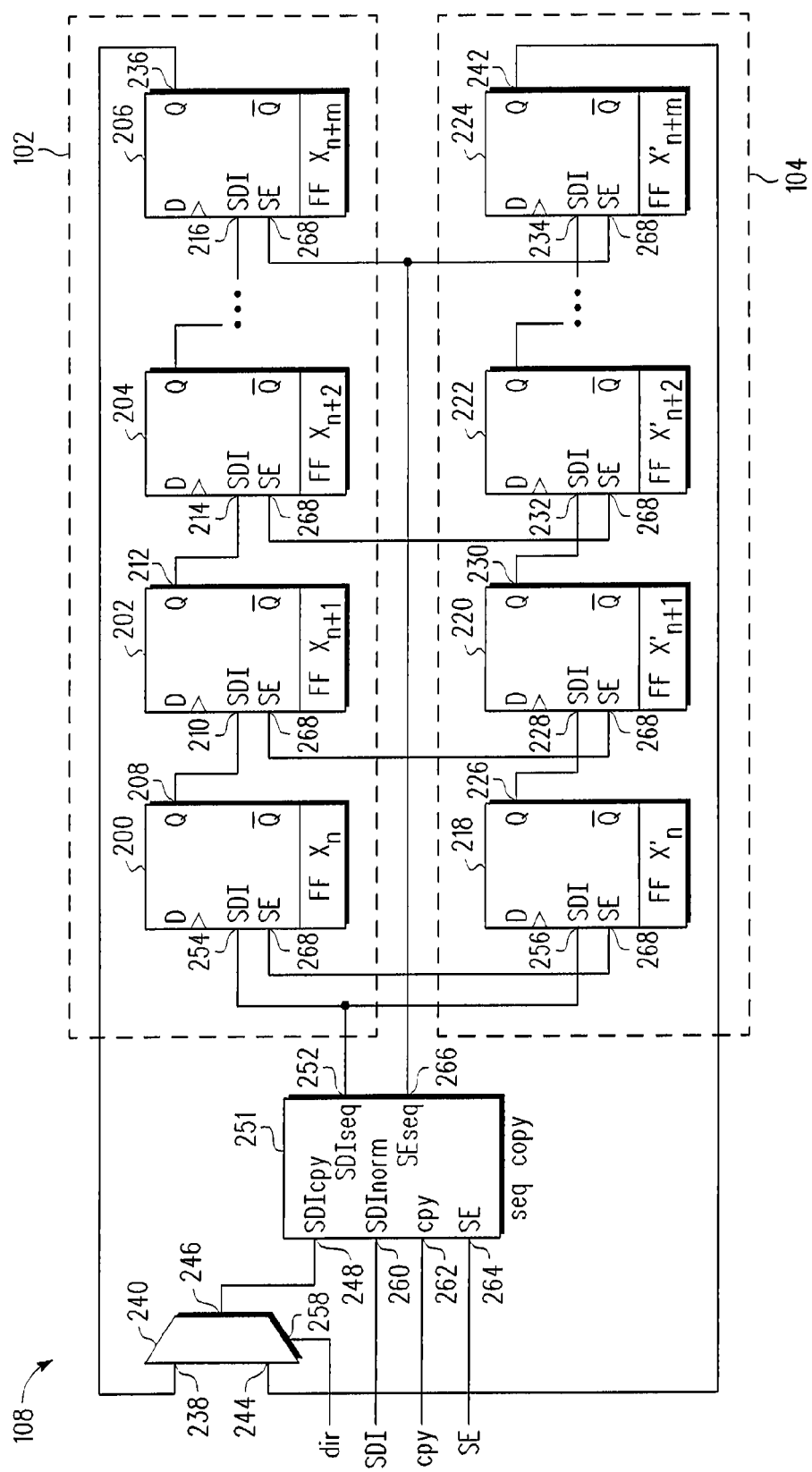
FIG. 2 is a schematic diagram of an example of a first apparatus in a first embodiment of the invention.

Referring to FIG. 2, the reference module 102 comprises a set of reference flip-flops comprising a plurality of reference flip-flops including a first reference flip-flop 200, a second reference flip-flop 202, a third reference flip-flop 204 and subsequent reference flip-flops up to an $m^{th}$ reference flip-flop 206. The first, second and third reference flip-flops 200, 202, 204 are serially coupled and intervening reference flip-flops (not shown) between the third reference flip-flop 204 and the $m^{th}$ reference flip-flop 206 are likewise serially coupled. In this respect, each reference flip-flop comprises a D input, a clock signal input, an scan data input (SDI), a scan enable (SE) input, a Q output and a $\overline{Q}$ output. In this respect, a Q output 208 of the first reference flip-flop 200 is coupled to an SDI input 210 of the second reference flip-flop 202, a Q output 212 of the second reference flip-flop 202 being coupled to an SDI input 214 of the third reference flip-flop 204. The chaining of a given reference flip-flop to a subsequent reference flip-flop is repeated in the above manner up to and including coupling a preceding Q output to an SDI input 216 of the $m^{th}$ reference flip-flop 206. Hence, it can be seen that the plurality of reference flip-flops of the set of reference flip-flops are daisy-chained together as part of the scan chain arrangement.

The target module 104 comprises a set of target flip-flops comprising a plurality of target flip-flops including a first target flip-flop 218, a second target flip-flop 220, a third target flip-flop 222 and subsequent target flip-flops up to an $m^{th}$ target flip-flop 224. The first, second and third target flip-flops 218, 220, 222 are serially coupled and intervening target flip-flops (not shown) between the third target flip-flop 222 and the $m^{th}$ target flip-flop 224 are likewise serially coupled. In this respect, each target flip-flop comprises a D input, a clock signal input, a scan data input (SDI), a scan enable (SE) input, a Q output and a $\overline{Q}$ output. In this respect, a Q output 226 of the first target flip-flop 218 is coupled to an SDI input 228 of the second target flip-flop 220, a Q output 230 of the second target flip-flop 220 being coupled to an SDI input 232 of the third target flip-flop 222. The chaining of a given target flip-flop to a subsequent target flip-flop is repeated in the above manner up to and including coupling a preceding Q output to an SDI input 234 of the $m^{th}$ target flip-flop 224. Hence, it can be seen that the plurality of target flip-flops of the set of target flip-flops are daisy-chained together as another part of the scan chain arrangement.

A Q output 236 of the $m^{th}$ reference flip-flop 206 is coupled to a first input 238 of a multiplexer 240 and a Q output 242 of the $m^{th}$ target flip-flop 224 is coupled to a second input 244 of the multiplexer 240. The multiplexer 240 is part of control logic 108. The control logic 108 also comprises test-copy control unit 251, an output 246 of the multiplexer 240 being coupled to a copy Scan Data Input ($SDI_{cpy}$) input 248 of test-copy control unit 251. A sequence Scan Data Input ($SDI_{seq}$) output 252 of the test-copy control unit 251 is coupled to an SDI input 254 of the first reference flip-flop 200 and an SDI input 256 of the first target flip-flop 218.

The multiplexer 240 has a direction control input 258. The test-copy control unit 251 has a normal Scan Data Input ($SDI_{norm}$) input 260, a copy input 262 and a scan enable (SE) input 264. The test-copy control unit 251 also comprises a sequence Scan Enable ($SE_{seq}$) output 266, the $SE_{seq}$ output 266 being coupled to respective Scan Enable (SE) inputs 268 of the reference flip-flops of the set of reference flip-flops and the target flip-flops of the set of target flip-flops.

The reference module 102 also comprises reference processing logic (not shown) and the target module 104 also comprises target processing logic (also not shown). The reference and target processing logics are the respective logics provided in the reference processing module 102 and the target processing module 104 in order to perform various processing tasks for which the reference processing module 102 and the target processing module 104 are being provided. The detailed architecture of the reference processing logic and the target processing logic is not directly relevant to the description of the use of the scan chain arrangement for synchronisation purposes and so the presence of the reference processing logic and the target processing logic is only acknowledged herein for the sake of completeness and no further detail will be provided as the skilled person should appreciate the nature and significance of the reference processing logic and the target processing logic.

It should however be noted that Q outputs of the plurality of reference flip flops are coupled to the reference processing logic, and D inputs of the plurality of reference flip-flops are also coupled to the reference processing logic for normal, non-test and non-synchronisation functions. Similarly, Q outputs of the plurality of target flip-flops are coupled to the target processing logic, and D inputs of the plurality of target flip-flops are also coupled to the target processing logic for normal, non-test and non-synchronisation functions.

Figure 3:
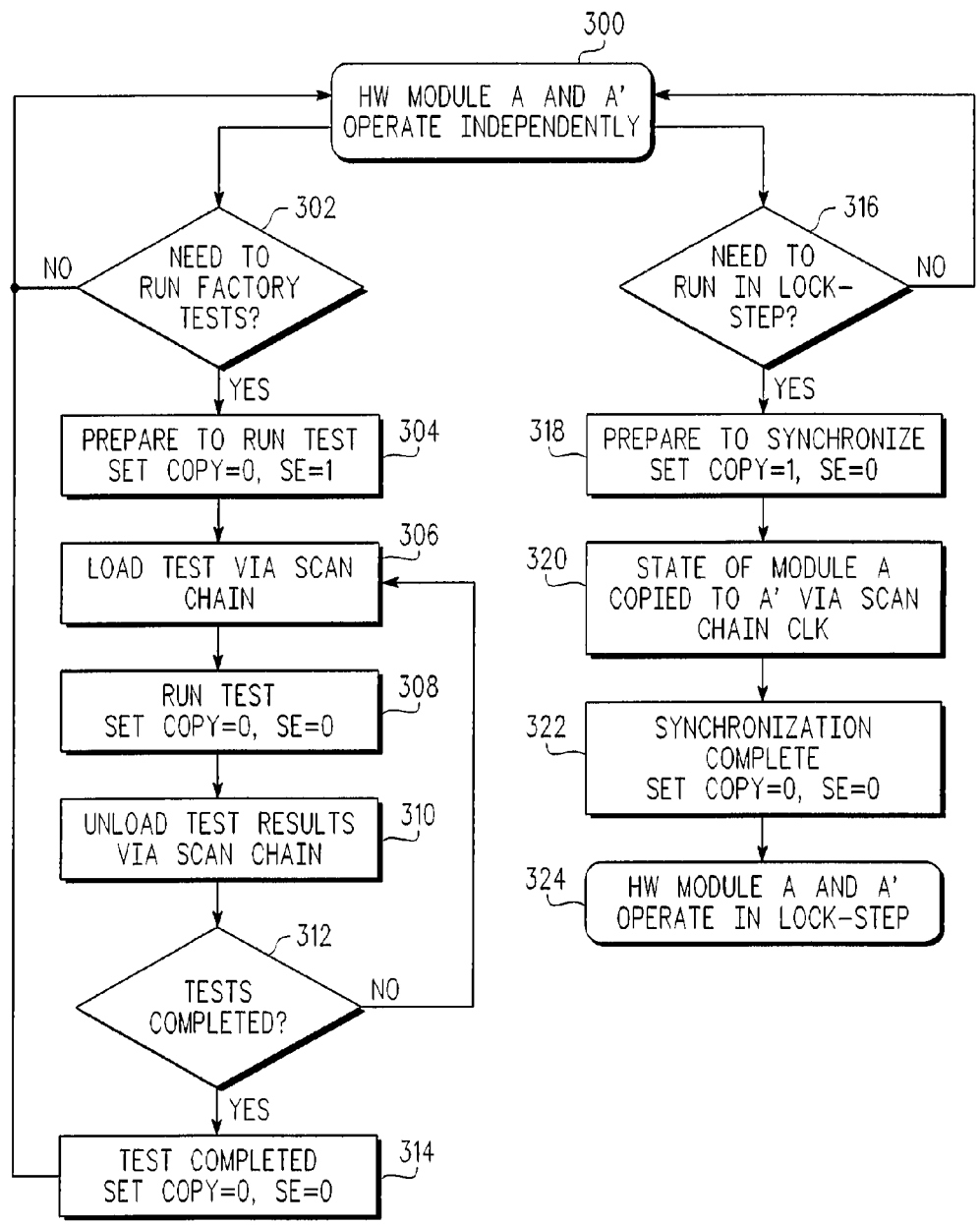
FIG. 3 is a flow diagram of an example of a first method of operation of the first apparatus of FIG. 2.

In operation (FIG. 3), a number of scenarios exist in relation to operation of the integrated circuit 100. However, only two scenarios are of relevance to describe the above hardware: a manufacture testing scenario and a synchronisation scenario. In this respect, at start-up and after initialisation, the reference module 102 and the target module 104 are operating independently (Step 300) of each other and so are not in synchronism.

In a first mode, the manufacture testing scenario supervisory logic (not shown) determines that a manufacturing test needs to be performed (Step 302), and sets the SE input 264 of the test-copy control unit 251 to logic 1. The copy input 262 is set to logic 0 and the $SDI_{cpy}$ input 248 remains in an initialised state. The logic 1 signal received at the SE input 264 of the test-copy control unit 251 is passed, by the test-copy control unit 251 via the $SE_{seq}$ output 266 thereof to the SE inputs 268 of the set of reference flip-flops and the set of target flip-flops. Test data is then loaded (Step 306) from a test apparatus (not shown) into the test-copy control unit 251 via the SDI$_{norm}$ input 260. The test-copy control unit 251 then passes the test data received to the SDI$_{seq}$ output 252 thereof, the test data received being applied to the SDI input 254 of the first reference flip-flop 200 and the SDI input 256 of the first target flip-flop 218, the data being clocked through the set of reference flip-flops and the set of target flip-flops until the m$^{th}$ reference flip-flop 206 and the m$^{th}$ target flip-flop 224 have been set.

In order to run the test loaded, the SE input 264 of the test-copy control unit 251 is then set to logic 0 and the copy input 262 remains at logic 0. The control logic 250 then ceases to load data into the set of reference flip-flops and the set of target flip-flops and the set of reference flip-flops and the set of target flip-flops are clocked in order to run (Step 308) the test loaded. As the execution of the test and the significance of the results of the test is known in the art and, in any event beyond the scope of the description herein, this aspect of the testing during manufacture will not be described further herein.

Once the test loaded has been run, the test data is unloaded from the set of reference flip-flops and the set of target flip-flops by clocking the set of reference flip-flops and the set of target flip-flops with a logic 0 input applied to the SDI input 254 of the first reference flip-flop 200 and the SDI input 256 of the first target flip-flop 218. Of course, the test data can be "flushed" out by the introduction of subsequent test data into the set of reference flip-flops and the set of target flip-flops or any other appropriate data.

If testing is deemed to be incomplete by a test engineer (Step 312) and a new test needs to be run, the above process (Steps 306 to 310) is repeated in respect of new test data. However, if testing has been completed, the supervisory logic sets (Step 314) the SE input 264 of the test-copy control unit 251 to logic 0 and the copy input 262 remains set at logic 0.

Turning to the synchronisation scenario, whilst the reference processing module 102 and the target processing module 104 are initially operating independently of each other, for some applications, for example requiring temporary handover of processing functions, it is necessary to synchronise the target processing resource 104 with the reference processing resource 102. Consequently, whilst the reference processing module 102 and the target processing module 104 are operating independently, it becomes necessary for the reference processing module 102 and the target processing module 104 to operate in synchronism. The supervisory logic (not shown) therefore decides (Step 316) that the reference processing resource 102 and the target processing resource 104 need to operate in synchronism, sometimes referred to as "lock-step".

In order to enter into a synchronised state, in a second mode, the supervisory logic sets (Step 318) the copy input 262 to logic 1, the SE input 264 to logic 0 because factory testing is not being performed, and the SDI$_{norm}$ input 260 is set to logic 0. The logic 1 applied to the copy input 262 constitutes a synchronisation signal. The SDI$_{cpy}$ input 248 is held in a state dependent upon the state of the direction control input 258 of the multiplexer 240. A direction signal is set by the supervisory logic, depending upon whether the target processing module 104 is to be synchronised to the reference processing module 102, or vice versa in which case the roles of reference and target are swapped. In this example, the direction control input 258 of the multiplexer is set to logic 1 indicative of a synchronisation of the target processing module 104 to the reference processing module 102. The state of the direction input 258 dictates whether the Q output 236 of the m$^{th}$ reference flip-flop 206 or the Q output 242 of the m$^{th}$ target flip-flop 224 is being coupled to the output 246 of the multiplexer 240.

As mentioned above, the target processing module 104 is to be synchronised to the reference processing module 102. Consequently, with the direction control input 258 of the multiplexer 240 being set to logic 1, the Q output 236 of the m$^{th}$ reference flip-flop 206 is effectively coupled to the SDI$_{cpy}$ input 248. As the copy input 262 has been set to logic 1, the test-copy control unit 251 couples the SDI$_{cpy}$ input 248 to the SDI$_{seq}$ output 252 and hence to the SDI input 254 of the first reference flip-flop 200 and the SDI input 256 of the first target flip-flop 218.

As a result of application of a clock signal (Step 320) to the set of reference flip-flops and the set of target flip-flops, data contained in the set of reference flip-flops is cyclically shifted around the first set of reference flip-flops substantially contemporaneously via the multiplexer 240 and the test-copy control unit 251 and continues doing so for as long as the multiplexer 240 and the test-copy control unit 251 couples the Q output 236 of the m$^{th}$ reference flip-flop 206 to the SDI input 254 of the first reference flip-flop 200. Hence, it can be seen that the contents of the set of reference flip-flops are cyclically shifted.

In relation to the set of target flip-flops, the state data from the set of reference flip-flops is being applied to the set of target flip-flops. Consequently, the state data that is input from the Q output 236 of the m$^{th}$ reference flip-flop 206 is applied to the SDI input 256 of the first target flip-flop 218 and hence clocked along the set of target flip-flops. The state data being fed back from the Q output 236 of the m$^{th}$ reference flip-flop 206 is therefore also being fed back into the set of target flip-flops for shifting therealong. In contrast, the Q output 242 of the m$^{th}$ target flip-flop is effectively open-circuit and so state data output by the Q output 242 of the m$^{th}$ target flip-flop is simply lost.

After a number of clock cycles, for example m clock cycles, corresponding to the length of the sets of reference and target flip-flops, the state data of the set of reference flip-flops has been copied to the set of target flip-flops and so copying is complete (Step 322). The supervisory logic monitors the number of clock cycles that has elapsed and once a full iteration of cycling of state data around the set of reference flip-flops and the set of target flip-flops has been achieved, the supervisory logic sets the copy input 262 of the test-copy control unit 251 to logic 0 before a next clock cycle begins, the test-copy control unit 251 de-coupling the SDI$_{cpy}$ input 248 from the SDI$_{seq}$ output 252 in response to the change at the copy input 262. The SE input 264 remains unchanged at logic 0.

Hence, copying of the state data of the set of reference flip-flops to the set of target flip-flops, and thus state synchronisation between the set of reference flip-flops and the set of target flip-flops, is achieved by re-using at least part of the scan chain architecture and/or methodology necessary in any event for testing purposes. The reference processing module 102 and the target processing module 104 then proceed to operate in synchronism (Step 324). Should copying and hence synchronisation in a opposite direction, as mentioned above, be required, the above process (Steps 318 to 322) are repeated using the direction control input 258 of the multiplexer 240 set to logic 0.

Figure 4:
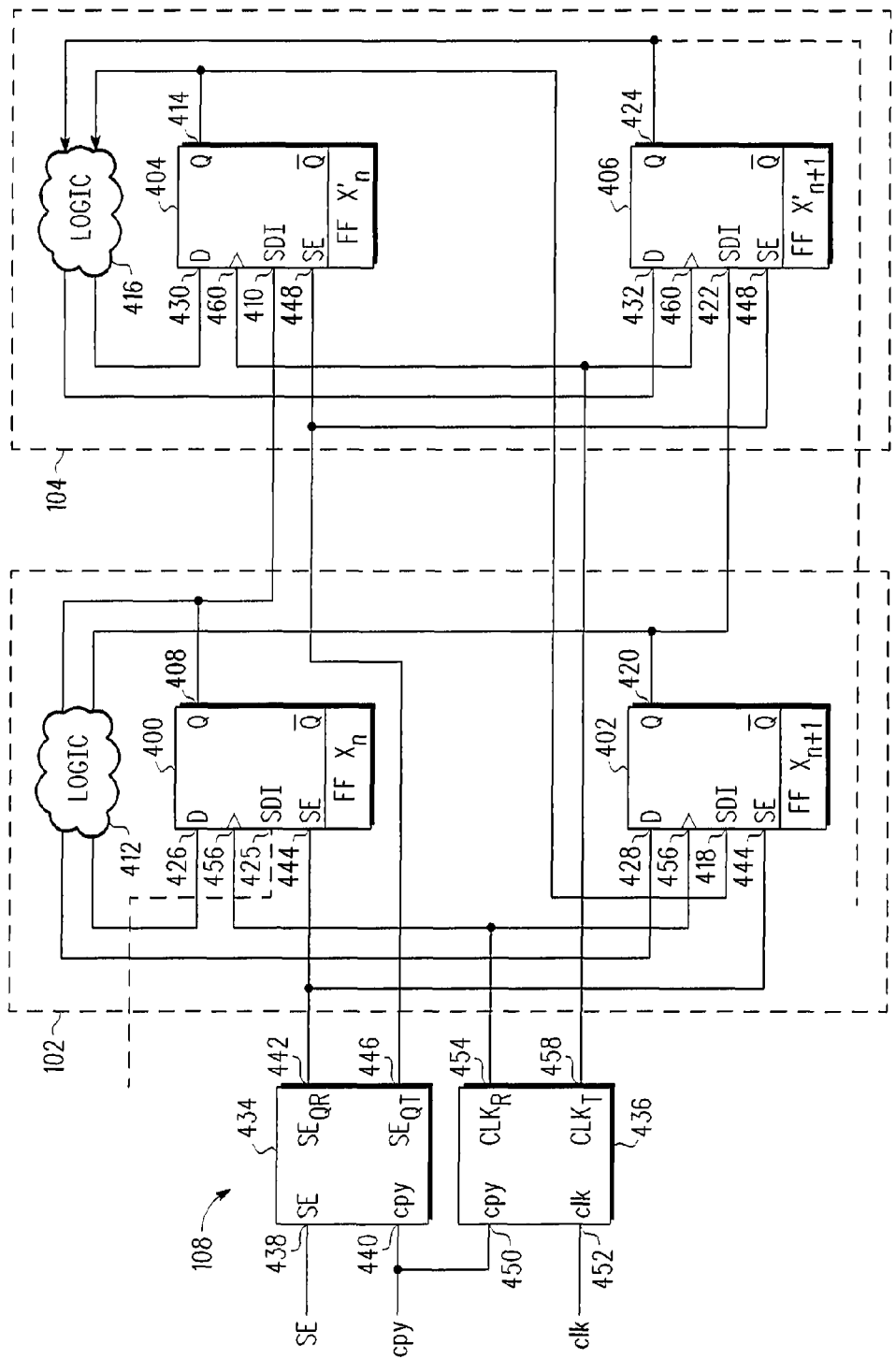
FIG. 4 is a schematic diagram of an example of a second apparatus in a second embodiment of the invention.

The above example illustrated a series technique for achieving synchronisation. Referring to FIG. 4, a first, unidirectional, parallel synchronisation technique is as follows.

The reference processing module 102 comprises a set of reference flip-flops comprising a plurality of reference flip-flops including, an $n^{th}$ reference flip-flop 400 and an $n+1^{th}$ reference flip-flop 402. The set of reference flip-flops have been labelled algebraically in order for the skilled person to better appreciate the generality of the set of reference flip-flops. However, the skilled person should appreciate that the set of reference flip-flops comprises a first, second, third, ..., $n^{th}$, $n+1^{th}$, ..., $n+x^{th}$ reference flip-flop.

The target processing module 104 similarly comprises a set of target flip-flops comprising a plurality of target flip-flops including, an $n^{th}$ target flip-flop 404 and an $n+1^{th}$ target flip-flop 406. The set of target flip-flops have also been labelled algebraically in order for the skilled person to better appreciate the generality of the set of target flip-flops. However, the skilled person should appreciate that the set of target flip-flops comprises a first, second, third, ..., $n^{th}$, $n+1^{th}$, ..., $n+x^{th}$ target flip-flop.

A Q output 408 of the $n^{th}$ reference flip-flop 400 is coupled to an SDI input 410 of the $n^{th}$ target flip-flop 404 and reference processing logic 412 of the reference processing module 102. A Q output 414 of the $n^{th}$ target flip-flop 404 is coupled to target processing logic 416 of the target processing module 104, and an SDI input 418 of the $n+1^{th}$ reference flip-flop 402.

The reference processing logic 412 and the target processing logic 416 are the respective logics provided in the reference processing module 102 and the target processing module 104 in order to perform various processing tasks for which the reference processing module 102 and the target processing module 104 are being provided. The detailed architecture of the reference processing logic 412 and the target processing logic 416 is not directly relevant to the description of the use of the scan chain arrangement for synchronisation purposes and so the presence of the reference processing logic 412 and the target processing logic 416 is only acknowledged herein for the sake of completeness and no further detail will be provided as the skilled person should appreciate the nature and significance of the reference processing logic 412 and the target processing logic 416.

A Q output 420 of the $n+1^{th}$ reference flip-flop 402 is coupled to the reference processing logic 412 and an SDI input 422 of the $n+1^{th}$ target flip-flop 405. A Q output 424 of the $n+1^{th}$ target flip-flop 406 is coupled to the target processing logic 416 and an SDI input (not shown) of a subsequent ($n+2^{th}$) reference flip-flop (also not shown). Similarly, an SDI input 425 of the $n^{th}$ reference flip-flop 400 is coupled to a Q output (not shown) of a preceding ($n-1^{th}$) target flip-flop (also not shown).

The reference processing logic 412 is also coupled to a D input 426 of the $n^{th}$ reference flip-flop 400 and a D input 428 of the $n+1^{th}$ reference flip-flop 402 for normal, non-test and non-synchronisation functions. Similarly, the target processing logic 416 is coupled to a D input 430 of the $n^{th}$ target flip-flop 404 and a D input 432 of the $n+1^{th}$ target flip-flop 406 also for normal, non-test and non-synchronisation, functions.

The control logic 108 comprises a scan enable control unit 434 and a clock signal control unit 436 for distributing a clock signal. The scan enable control unit 434 may comprise a scan enable (SE) input 438 and a first copy input 440. A first scan enable output ($SE_{OR}$) 442 is coupled to respective SE inputs 444 of the $n^{th}$ reference flip-flop 400 and the $n+1^{th}$ reference flip-flop 402. Similarly, a second scan enable output ($SE_{OT}$) 446 of the scan enable control unit 434 is coupled to respective SE inputs 448 of the $n^{th}$ target flip-flop 404 and the $n+1^{th}$ target flip-flop 406.

The clock signal control unit 436 may comprise a second copy input 450 and a clock signal input 452, the second copy input 450 being coupled to the first copy input 440 of the scan enable control unit 434. In order to control clocking of the $n^{th}$ reference flip-flop 400 and the $n+1^{th}$ reference flip-flop 402, a first clock output ($CLK_R$) 454 is coupled to respective clock inputs 456 of $n^{th}$ reference flip-flop 400 and the $n+1^{th}$ reference flip-flop 402. Likewise, in order to control clocking of the $n^{th}$ target flip-flop 404 and the $n+1^{th}$ target flip-flop 406, a second clock output ($CLK_T$) 458 is coupled to respective clock inputs 460 of $n^{th}$ target flip-flop 404 and the $n+1^{th}$ target flip-flop 406.

Figure 5:
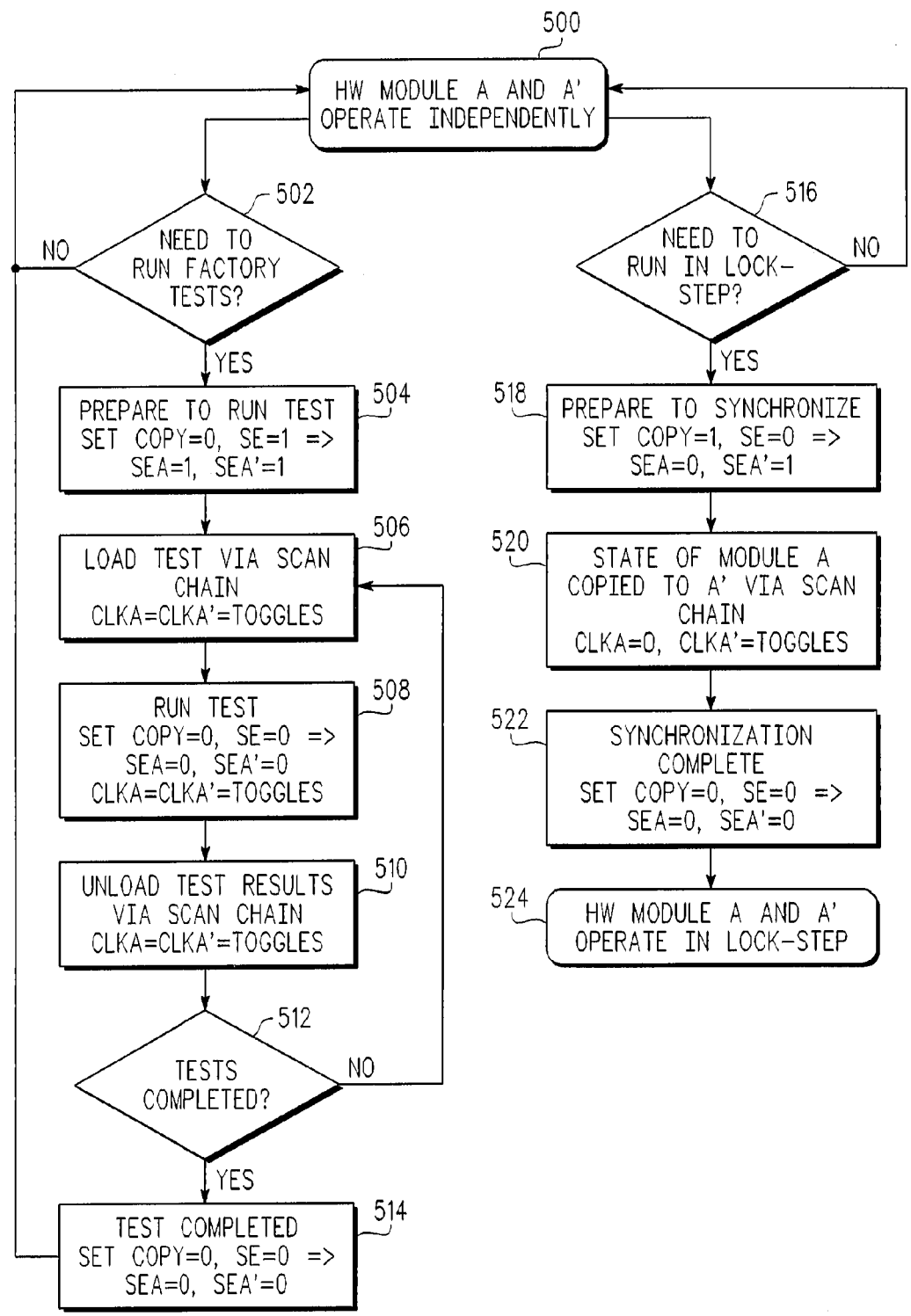
FIG. 5 is a flow diagram of an example of a second method of operation of the second apparatus of FIG. 4.

Turning to FIG. 5, in operation and like the preceding example, a number of scenarios exist in relation to operation of the integrated circuit 100. However, only two scenarios are of relevance to describe operation of the above uni-directional parallel synchronisation hardware: a manufacture testing scenario and a synchronisation scenario. In this respect, at start-up and after initialisation, the reference module 102 and the target module 104 are operating independently (Step 500) of each other and so are not in synchronism.

In a first mode, for the manufacture testing scenario supervisory logic (not shown) determines that a manufacturing test needs to be performed (Step 502), and sets (Step 504) the SE input 438 to logic 1 and the copy input 440 to logic 0. The logic (not shown) of the scan enable control unit 434 responds to the SE input 438 of the scan enable control unit 434 being set to logic 1 by setting the first scan enable output ($SE_{OR}$) 442 and the second scan enable output ($SE_{OT}$) 446 to logic 1 as well. Consequently, the SE input 444 of the set of reference flip-flops and the SE inputs 448 of the set of target flip-flops are also set to logic 1 causing the set of reference flip-flops and the set of target flip-flops to enter a test mode.

Test data is then loaded (Step 506) into the set of reference flip-flops and the set of target flip-flops in the following manner, the $n^{th}$ reference flip-flop 400 being used as a route into the set of reference flip-flops and the set of target flip-flops. Consequently, the test data is provided at the SDI input 425 of the $n^{th}$ reference flip-flop 400 and clocked through the set of reference flip-flops and the set of target flip-flops in a serpentine or winding manner, due to the serpentine-like coupling of flip-flops of the set of reference flip-flops and the set of target flip-flops in an alternating cascading manner. In order to clock the test data through both the set of reference flip-flops and the set of target flip-flops, both are clocked in the following manner by the clock signal control unit 436.

The logic (not shown) of the clock signal control unit 436 is arranged to receive a clock signal (CLK) via the clock signal input 452 and alternate provision of the clock signal between the first clock output ($CLK_R$) 454 and the second clock output ($CLK_T$) 458. Consequently, the set of reference flip-flops are clocked first, resulting in test data being input to the $n^{th}$ reference flip-flop 400. On a following clock cycle, the clock signal control unit 436 provides the clock signal at the second clock output ($CLK_T$) 458 instead of the first clock output ($CLK_R$) 454 and hence to the set of target flip-flops, resulting in the data received by the $n^{th}$ reference flip-flop being copied to the $n^{th}$ target flip-flop 404 via the SDI input 410 of the $n^{th}$ target flip-flop 404. The clock signal control unit 436 then hands the clock signal back to the first clock output ($CLK_R$) 454 in order to clock the set of reference flip-flops and hence a succeeding bit of the last test data into the $n^{th}$ reference flip-flop 400. However, it should be appreciated that for some applications, the first clock output ($CLK_R$) 454 and the second clock output ($CLK_T$) 458 are applied substantially simultaneously. Hence, it can be seen that the set of reference flip-flops and the set of target flip-flops are clocked, resulting in the test data following the serpentine data path mentioned above through the interconnected set of reference flip-flops and the set of target flip-flops. In this example, the test data is clocked through the set of reference flip-flops and the set of target flip-flops until the n+1$^{th}$ target flip-flop 406 has been set. However, the skilled person will appreciate that typically more flip-flops are involved than the small number of flip-flops in this simple example.

In order to run the test loaded, the SE input 438 of the scan enable control unit 434 is then set to logic 0 and the first copy input 440 of the scan enable control unit 434 and the second copy input 450 of the clock signal control unit 436 are set to logic 0. The control logic 108 then ceases to load data into the set of reference flip-flops and the set of target flip-flops and the set of reference flip-flops and the set of target flip-flops are clocked by the clock signal control unit 436 in order to run (Step 508) the test loaded. As the execution of the test and the significance of the results of the test is known in the art and, in any event beyond the scope of the description herein, this aspect of the testing during manufacture will not be described further herein.

Once the test loaded has been run, the test data is unloaded (Step 510) from the set of reference flip-flops and the set of target flip-flops by clocking the set of reference flip-flops and the set of target flip-flops with a logic 0 applied to the SDI input 425 of the n$^{th}$ reference flip-flop 400 so as to propagate logic 0's through the set of reference flip-flops and the set of target flip-flops, thereby flushing the test data out of the reference set of flip-flops and the target set of flip-flops. Of course, the test data can be "flushed" out by the introduction of subsequent test data into the set of reference flip-flops and the set of target flip-flops or any other appropriate data.

If testing is deemed to be incomplete by a test engineer (Step 512) and a new test needs to be run, the above process (Steps 506 to 510) is repeated in respect of new test data. However, if testing has been completed, the SE input 438 of the scan enable control unit 434 is set (Step 514) to logic 0 and the first copy input 440 of the scan enable control unit 434 and the second copy input 450 of the clock signal control unit 436 remain at logic 0. Consequently, the logic of the scan enable control unit 434 responds to the SE input 438 of the scan enable control unit 434 being set to logic 0 by setting the first scan enable output (SE$_{OR}$) 442 and the second scan enable output (SE$_{OT}$) 446 to logic 0 as well. Consequently, the SE inputs 444 of the set of reference flip-flops and the SE inputs 448 of the set of target flip-flops are also set to logic 0 causing the set of reference flip-flops and the set of target flip-flops to leave the test mode.

Turning to the synchronisation scenario, whilst the reference processing module 102 and the target processing module 104 are initially operating independently of each other, for some applications as mentioned above, for example requiring temporary handover of processing functions, it is necessary to synchronise the target processing resource 104 with the reference processing resource 102. Consequently, whilst the reference processing module 102 and the target processing module 104 are operating independently, it becomes necessary, in this example, for the reference processing module 102 and the target processing module 104 to operate in synchronism. The supervisory logic (not shown) therefore decides (Step 516) that the reference processing resource 102 and the target processing resource 104 need to operate in synchronism, sometimes referred to as "lock-step".

In order to enter into a synchronised state, in a second mode, the supervisory logic sets (Step 518) the first copy input 440 of the scan enable control unit 400 and the second copy input 450 of the clock signal control unit 436 to logic 1, and the SE input 438 of the scan enable control unit 434 to logic 0, because factory testing is not being performed; the clock signal is received at the clock signal input 452 of the clock signal control unit 436. The logic 1 applied to the first and second copy inputs 440, 450 constitutes a synchronisation signal. As a result of the logic 0 applied to the SE input 438 and the logic 1 applied to the first copy input 440 of the scan enable control unit 434, the logic of the scan enable control unit 434 sets the first scan enable output (SE$_{OR}$) 442 to logic 0 and the second scan enable output (SE$_{OT}$) 446 to logic 1 and so the SE inputs 444 of the set of reference flip-flops are set to logic 0 and the SE inputs 448 of the set of target flip-flops are set to logic 1 ensuring that the set of reference flip-flops is not in the test mode and the set of target flip-flops is in the test mode. No data is provided at the SDI input 425 of the n$^{th}$ reference flip-flop 400.

As mentioned above, the target processing module 104 is to be synchronised to the reference processing module 102. In this respect, since the first and second copy inputs 440, 450 have been set to logic 1, the clock signal control unit 436 only provides the received clock signal to the set of target flip-flops via the second clock output (CLK$_T$) 458.

As a result of application of the clock signal to the set of target flip-flops, data contained in the set of reference flip-flops is recorded, in parallel, in the set of parallel flip-flops, thereby copying the state data held by each flip-flop of the set of reference flip-flops respectively to each flip-flop of the set of target flip-flops (Step 520).

As in relation to the previous example, the supervisory logic monitors elapse of clock cycles and after a number of clock cycles has elapsed, for example 1 clock cycle, corresponding to the number of clock cycles needed to execute the copy of the state data, the supervisory logic deems the copying of the state data to be complete (Step 522) and sets the first copy input 440 of the scan enable control unit 434 and the second copy input 450 of the clock signal control unit 436 are set to logic 0. The logic 0 applied to the SE input 438 of the scan enable control unit 434 remains unchanged. However, due to the logic 0 now applied to the first copy input 440 of the scan enable control logic 434, the logic of the scan enable control unit 434 maintains the first scan enable output (SE$_{OR}$) 442 to logic 0 and returns the second scan enable output (SE$_{OT}$) 446 to logic 0.

Hence, copying of the state data of the set of reference flip-flops to the set of target flip-flops, and thus state synchronisation between the set of reference flip-flops and the set of target flip-flops, is achieved by re-using at least part of the scan chain architecture and/or methodology necessary in any event for testing purposes. As the second copy input 450 of the clock signal control unit 436 has been set to logic 0, the clock signal control unit 436 provides the clock signal to both the first clock output (CLK$_R$) 454 and the second clock output (CLK$_T$) 458. Consequently, the set of reference flip-flops and the set of target flip-flops are clocked in synchronism. The reference processing module 102 and the target processing module 104 therefore proceed to operate in synchronism (Step 524).

Figure 6:
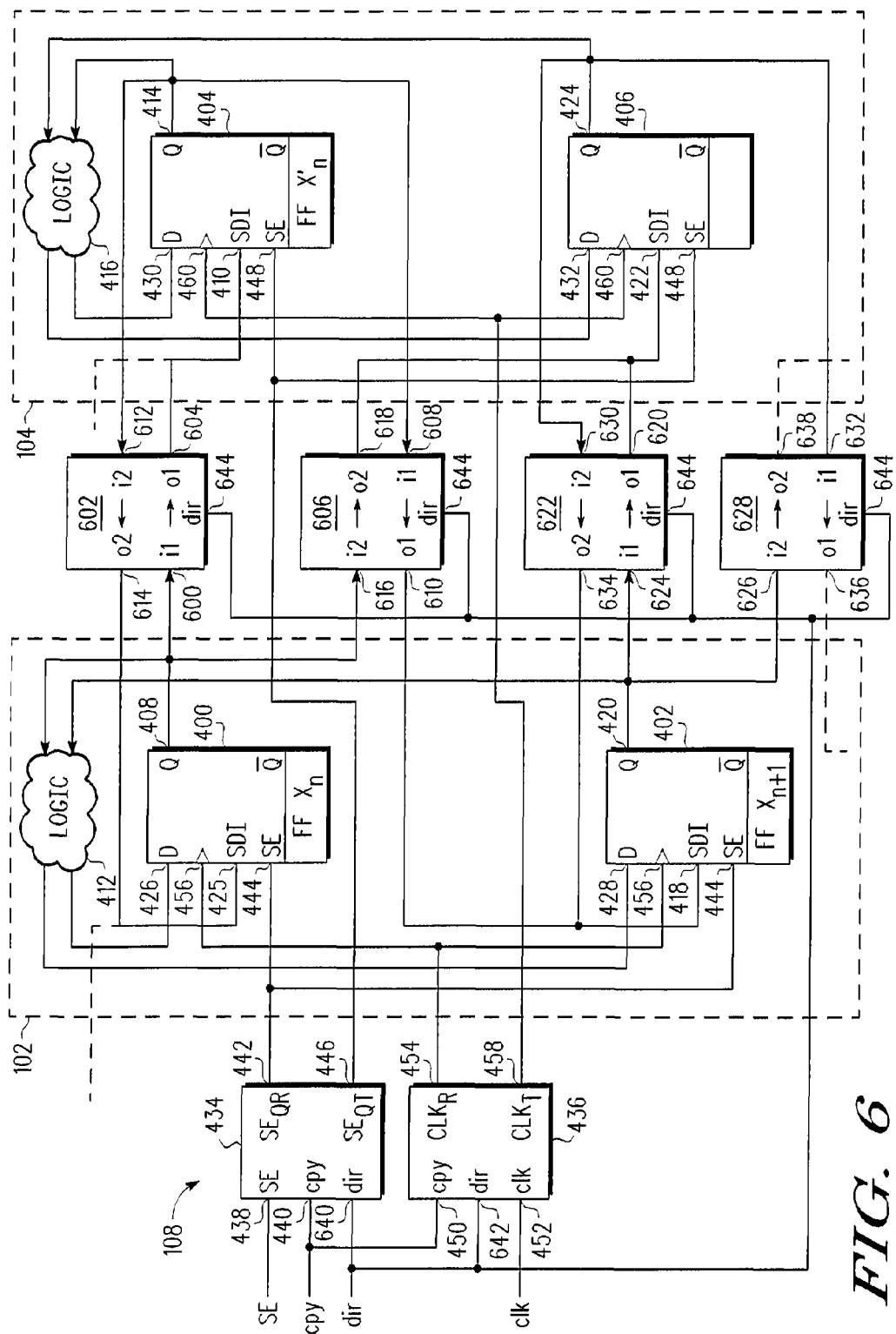
FIG. 6 is a schematic diagram of an example of a third apparatus in a third embodiment of the invention.

In another embodiment (FIG. 6), should direction of copying and hence synchronisation need to be selectable, the above described unidirectional embodiment can be modified as follows to provide bi-directional functionality.

As in relation to the previous embodiment, the reference processing module 102 comprises a set of reference flip-flops comprising a plurality of reference flip-flops including, an n$^{th}$ reference flip-flop 400 and an n+1$^{th}$ reference flip-flop 402. The set of reference flip-flops have again been labelled algebraically in order for the skilled person to better appreciate the generality of the set of reference flip-flops. However, the skilled person should appreciate that the set of reference flip-flops comprises a first, second, third, . . . , n$^{th}$, n+1$^{th}$, . . . , n+x$^{th}$ reference flip-flop.

The target processing module 104 similarly comprises a set of target flip-flops comprising a plurality of target flip-flops including, an $n^{th}$ target flip-flop 404 and an $n+1^{th}$ target flip-flop 406. The set of target flip-flops have also again been labelled algebraically in order for the skilled person to better appreciate the generality of the set of target flip-flops. However, the skilled person should appreciate that the set of target flip-flops comprises a first, second, third, . . . , $n^{th}$, $n+1^{th}$, . . . , $n+x^{th}$ target flip-flop.

As in relation to the previous embodiment, the reference processing logic 412 and the target processing logic 416 are the respective logics provided in the reference processing module 102 and the target processing module 104, in order to perform various processing tasks for which the reference processing module 102 and the target processing module 104 are being provided. The detailed architecture of the reference processing logic 412 and the target processing logic 416 is not directly relevant to the description of the use of the scan chain arrangement for synchronisation purposes and so again the presence of the reference processing logic 412 and the target processing logic 416 is only acknowledged herein for the sake of completeness and no further detail will be provided as the skilled person should appreciate the nature and significance of the reference processing logic 412 and the target processing logic 416.

A Q output 408 of the $n^{th}$ reference flip-flop 400 is coupled to a first input 600 of a first direction control logic 602 and reference processing logic 412 of the reference processing module 102, an output 604 of the first direction control logic being coupled to an SDI input 410 of the $n^{th}$ target flip-flop 404. A Q output 414 of the $n^{th}$ target flip-flop 404 is coupled to target processing logic 416 of the target processing module 104 and a first input 608 of second direction control logic 606, a first output 610 of the second direction control logic 606 being coupled to an SDI input 418 of the $n+1^{th}$ reference flip-flop 402. The Q output 414 of the $n^{th}$ target flip-flop 404 is also coupled to a second input 612 of the first direction control logic 602, a second output 614 of the first direction control logic 602 being coupled to an SDI input 425 of the $n^{th}$ reference flip-flop 400.

A second input 616 of the second direction control logic 606 is coupled to the reference processing logic 412 and the first input 600 of the first direction control logic 602, a second output 618 of the second direction control logic 606 being coupled to an SDI input 422 of the $n+1^{th}$ target flip-flop 406 and a first output 620 of third direction control logic 622. A Q output 420 of the $n+1^{th}$ reference flip-flop 402 is coupled to the reference processing logic 412, a first input 624 of the third direction control logic 622 and a second input 626 of fourth direction control logic 628. A second input 630 of the third direction control logic 622 is coupled to a Q output 424 of the $n+1^{th}$ target flip-flop 406, the target processing logic 416 and a first input 632 of the fourth direction control logic 628. A second output 634 of the third direction control logic 622 is coupled to the SDI input 418 of the $n+1^{th}$ reference flip-flop 402 and the first input 610 of the second direction control logic 606. A first output 636 of the fourth direction control logic 628 is coupled to an SDI input (not shown) of a subsequent ($n+2^{th}$) reference flip-flop (also not shown) and a second output (not shown) of subsequent direction control logic (also not shown). Similarly, A second output 638 of the fourth direction control logic 628 is coupled to an SDI input (not shown) of a subsequent ($n+2^{th}$) target flip-flop (also not shown) and a first output (not shown) of the subsequent ($n+2^{th}$) direction control logic.

The reference processing logic 412 is also coupled to a D input 426 of the $n^{th}$ reference flip-flop 400 and a D input 428 of the $n+1^{th}$ reference flip-flop 402 for normal, non-test and non-synchronisation, functions. Similarly, the target processing logic 416 is coupled to a D input 430 of the $n^{th}$ target flip-flop 404 and a D input 432 of the $n+1^{th}$ target flip-flop 406 also for normal, non-test and non-synchronisation, functions.

The control logic 108 may comprise a scan enable control unit 434 and a clock signal control unit 436. The scan enable control unit 434 may comprise a scan enable (SE) input 438, a first copy input 440 and a first direction control input 640. A first scan enable output ($SE_{OR}$) 442 of the scan enable control unit 434 is coupled to respective SE inputs 444 of the $n^{th}$ reference flip-flop 400 and the $n+1^{th}$ reference flip-flop 402. Similarly, a second scan enable output ($SE_{OT}$) 446 of the scan enable control unit 434 is coupled to respective SE inputs 448 of the $n^{th}$ target flip-flop 404 and the $n+1^{th}$ target flip-flop 406.

The clock signal control unit 436 may comprise a second copy input 450 and a clock signal input 452, the second copy input 450 being coupled to the first copy input 440 of the scan enable control unit 434. The clock signal control unit 436 also comprises a second direction control input 642.

In order to control clocking of the $n^{th}$ reference flip-flop 400 and the $n+1^{th}$ reference flip-flop 402, a first clock output ($CLK_R$) 454 is coupled to respective clock inputs 456 of $n^{th}$ reference flip-flop 400 and the $n+1^{th}$ reference flip-flop 402. Likewise, in order to control clocking of the $n^{th}$ target flip-flop 404 and the $n+1^{th}$ target flip-flop 406, a second clock output ($CLK_T$) 458 is coupled to respective clock inputs 460 of $n^{th}$ target flip-flop 404 and the $n+1^{th}$ target flip-flop 406.

The first direction control input 640 of the scan enable control unit 434 and the second direction control input 642 of the clock signal control unit 452 are coupled to respective direction control inputs 644 of the first, second, third and fourth control logic 602, 606, 622, 628.

Figure 7:
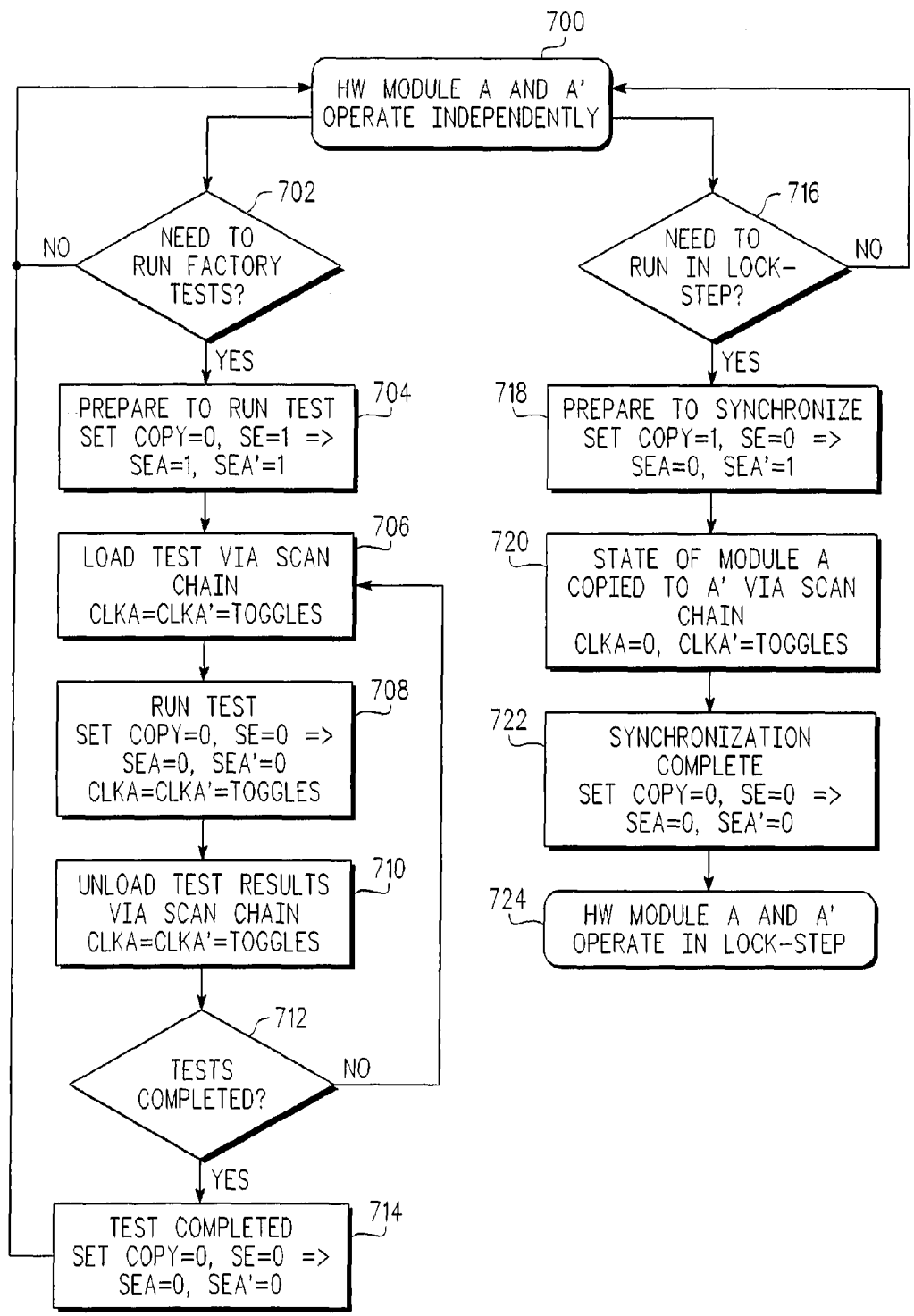
FIG. 7 is a flow diagram of an example of a third method of operation of the third apparatus of FIG. 6.

Turning to FIG. 7, in operation and like the preceding example, a number of scenarios exist in relation to operation of the integrated circuit 100. However, only two scenarios are of relevance to describe operation of the above bi-directional synchronisation hardware: a manufacture testing scenario and a synchronisation scenario. In this respect, at start-up and after initialisation, the reference module 102 and the target module 104 are operating independently (Step 700) of each other and so are not in synchronism.

In a first mode, for the manufacture testing scenario, the supervisory logic (again not shown) determines that a manufacturing test needs to be performed (Step 702), and sets (Step 704) the SE input 438 to logic 1, the first and second copy inputs 440, 450 to logic 0 and the first and second direction control inputs 640, 642 to logic 0. The first direction control logic 602 responds to the logic 0 applied to the first and second direction control inputs 640, 650 by enabling coupling between the first input 600 and the first output 604 thereof and preventing coupling between the second input 612 and the second output 614 thereof. The second direction control logic 606 responds to the logic 0 applied to the first and second direction control inputs 640, 650 by enabling coupling between the first input 608 and the first output 610 thereof and preventing coupling between the second input 616 and the second output 618 thereof. The third direction control logic 622 responds to the logic 0 applied to the first and second direction control inputs 640, 650 in a similar manner by enabling coupling between the first input 624 and the first output 620 thereof and preventing coupling between the second input 630 and the second output 634 thereof. The fourth direction control logic 628 responds to the logic 0 applied to the first and second direction control inputs 640, 650 by enabling coupling between the first input 632 and the first output 636 thereof and preventing coupling between the second input 626 and the second output 638 thereof.

The logic (not shown) of the scan enable control unit 434 responds to the SE input 438 of the scan enable control unit 434 being set to logic 1 by setting the first scan enable output ($SE_{OR}$) 442 and the second scan enable output ($SE_{OT}$) 446 to logic 1. Consequently, the SE inputs 444 of the set of reference flip-flops and the SE inputs 448 of the set of target flip-flops are also set to logic 1 causing the set of reference flip-flops and the set of target flip-flops to enter a test mode.

The connectivity between the Q output 408 of the $n^{th}$ reference flip-flop 400 and the SDI input 410 of the $n^{th}$ target flip-flop 404 is therefore the same as in relation to the previous unidirectional embodiment. Similarly, the connectivity between the Q output 420 of the $n+1^{th}$ reference flip-flop 402 and the SDI input 422 of the $n+1^{th}$ target flip-flop 406 is therefore the same as in relation to the previous unidirectional embodiment. Furthermore, the connectivity between the Q output 414 of the $n^{th}$ target flip-flop 404 and the SDI input 418 of the $n+1^{th}$ reference flip-flop 402 is the same as in relation to the previous embodiment as a result of the current setting of the second direction control logic 606.

Test data is then loaded (Step 706) into the set of reference flip-flops and the set of target flip-flops in the following manner. The $n^{th}$ reference flip-flop 400 is used as a route into the set of reference flip-flops and the set of target flip-flops. Consequently, the test data is provided at the SDI input 425 of the $n^{th}$ reference flip-flop 400 and clocked through the set of reference flip-flops and the set of target flip-flops in a serpentine or winding manner, due to the serpentine-like coupling of flip-flops of the set of reference flip-flops and the set of target flip-flops in an alternating cascading manner as dictated by the first, second, third and fourth direction control logics 602, 606, 622, 628. In order to clock the test data through both the set of reference flip-flops and the set of target flip-flops, the set of reference flip-flops and the set of target flip-flops are clocked in the following manner by the clock signal control unit 436.

The logic (not shown) of the clock signal control unit 436 is arranged to receive a clock signal (CLK) via the clock signal input 452 and alternate provision of the clock signal between the first clock output ($CLK_R$) 454 and the second clock output ($CLK_T$) 458. Consequently, the set of reference flip-flops are clocked first, resulting in test data being input to the $n^{th}$ reference flip-flop 400. On a following clock cycle, the clock signal control unit 436 provides the clock signal at the second clock output ($CLK_T$) 458 instead of the first clock output ($CLK_R$) 454 and hence to the set of target flip-flops, resulting in the data received by the $n^{th}$ reference flip-flop being copied to the $n^{th}$ target flip-flop 404 via the SDI input 410 of the $n^{th}$ target flip-flop 404. The clock signal control unit 436 then hands the clock signal back to the first clock output ($CLK_R$) 454 in order to clock the set of reference flip-flops and hence a succeeding bit of the test data into the $n^{th}$ reference flip-flop 400. Hence, it can be seen that the set of reference flip-flops and the set of target flip-flops are alternately clocked, resulting in the test data following the serpentine data path mentioned above through the interconnected set of reference flip-flops and the set of target flip-flops. In this example, the test data is clocked through the set of reference flip-flops and the set of target flip-flops until the $n+1^{th}$ target flip-flop 406 has been set. However, the skilled person will appreciate that typically more flip-flops are involved than the small number of flip-flops in this simple example.

In order to run the test loaded, the SE input 438 of the scan enable control unit 434 is then set to logic 0 and the first copy input 440 of the scan enable control unit 434 and the second copy input 450 of the clock signal control unit 436 are set to logic 0. The control logic 250 then ceases to load data into the set of reference flip-flops and the set of target flip-flops, and the set of reference flip-flops and the set of target flip-flops are clocked by the clock signal control unit 436 in order to run (Step 708) the test loaded. As the execution of the test and the significance of the results of the test is known in the art and, in any event beyond the scope of the description herein, this aspect of the testing during manufacture will not be described further herein.

Once the test loaded has been run, the test data is unloaded (Step 710) from the set of reference flip-flops and the set of target flip-flops by clocking the set of reference flip-flops and the set of target flip-flops with a logic 0 applied to the SDI input 426 of the $n^{th}$ reference flip-flop 400 so as to propagate logic 0's through the set of reference flip-flops and the set of target flip-flops, thereby flushing the test data out of the reference set of flip-flops and the target set of flip-flops.

If testing is deemed to be incomplete (Step 712) by a test engineer and a new test needs to be run, the above process (Steps 706 to 710) is repeated in respect of new test data. However, if testing has been completed, the SE input 438 of the scan enable control unit 434 is set (Step 714) to logic 0 and the first copy input 440 of the scan enable control unit 434 and the second copy input 450 of the clock signal control unit 436 remain at logic 0. Consequently, the logic of the scan enable control unit 434 responds to the SE input 438 of the scan enable control unit 434 being set to logic 0 by setting the first scan enable output ($SE_{OR}$) 442 and the second scan enable output ($SE_{OT}$) 446 to logic 0 as well. Consequently, the SE input 444 of the set of reference flip-flops and the SE inputs 448 of the set of target flip-flops are also set to logic 0 causing the set of reference flip-flops and the set of target flip-flops to leave the test mode.

Turning to the synchronisation scenario, whilst the reference processing module 102 and the target processing module 104 are initially operating independently of each other, for some applications as mentioned above, for example requiring temporary handover of processing functions, it is necessary to synchronise the target processing resource 104 with the reference processing resource 102. Consequently, whilst the reference processing module 102 and the target processing module 104 are operating independently, it becomes necessary, in this example, for the reference processing module 102 and the target processing module 104 to operate in synchronism. The supervisory logic (not shown) therefore decides (Step 716) that the reference processing resource 102 and the target processing resource 104 need to operate in synchronism, sometimes referred to as "lock-step".

In order to enter into a synchronised state, in a second mode, the supervisory logic sets (Step 718) the first copy input 440 of the scan enable control unit 400 and the second copy input 450 of the clock signal control unit 436 to logic 1, and the SE input 438 of the scan enable control unit 434 to logic 0, because factory testing is not being performed; the clock signal is received at the clock signal input 452 of the clock signal control unit 436. The logic 1 applied to the first and second copy inputs 440, 450 constitutes a synchronisation signal. As a result of the logic 0 applied to the SE input 438 and the logic 1 applied to the first copy input 440 of the scan enable control unit 434, the logic of the scan enable control unit 434 sets the first scan enable output ($SE_{OR}$) 442 to logic 0 and the second scan enable output ($SE_{OT}$) 446 to logic 1 and so the SE inputs 444 of the set of reference flip-flops are set to logic 0 and the SE inputs 448 of the set of target flip-flops are set to logic 1 ensuring that the set of reference flip-flops is not in the test mode and the set of target flip-flops is in the test mode. No data is provided at the SDI input 425 of the $n^{th}$ reference flip-flop 400. In this example, the logic 0 applied to the first and second direction control inputs 640, 642 remains unchanged, as logic 0 is indicative of copying state data from the reference set of flip-flops to the target set of flip-flops, a logic 1 being indicative of copying in the reverse direction.

As mentioned above, the target processing module 104 is to be synchronised to the reference processing module 102. In this respect, since the first and second copy inputs 440, 450 have been set to logic 1, the clock signal control unit 436 only provides the received clock signal to the set of target flip-flops via the second clock output ($CLK_T$) 458.

As a result of application of the clock signal to the set of target flip-flops, data contained in the set of reference flip-flops is recorded, in parallel, in the set of target flip-flops, thereby copying the state data held by each flip-flop of the set of reference flip-flops respectively to each flip-flop of the set of target flip-flops (Step 720).

As in relation to the previous example, the supervisory logic monitors elapse of clock cycles and after a number of clock cycles has elapsed, for example 1 clock cycle, corresponding to the number of clock cycles needed to execute the copy of the state data, the supervisory logic deems the copying of the state data to be complete (Step 722) and sets the first copy input 440 of the scan enable control unit 434 and the second copy input 450 of the clock signal control unit 436 to logic 0. The logic 0 applied to the SE input 438 of the scan enable control unit 434 remains unchanged. However, due to the logic 0 now applied to the first copy input 440 of the scan enable control logic 434, the logic of the scan enable control unit 434 maintains the first scan enable output ($SE_{OR}$) 442 to logic 0 and sets the second scan enable output ($SE_{OT}$) 446 to logic 0.

Hence, copying of the state data of the set of reference flip-flops to the set of target flip-flops, and thus state synchronisation between the set of reference flip-flops and the set of target flip-flops, is achieved by re-using at least part of the scan chain architecture and/or methodology necessary in any event for testing purposes. As the second copy input 450 of the clock signal control unit 436 has been set to logic 0, the clock signal control unit 436 provides the clock signal to both the first clock output ($CLK_R$) 454 and the second clock output ($CLK_T$) 458. Consequently, the set of reference flip-flops and the set of target flip-flops are clocked in synchronism. The reference processing module 102 and the target processing module 104 therefore proceed to operate in synchronism (Step 724).

Should copying and hence synchronisation in the opposite direction, as mentioned above, be required, the above process (Steps 718 to 722) are repeated using the first and second direction control inputs 640, 642 set to logic 1, resulting in the logic 1 also being applied to the direction control inputs of the first, second, third and fourth direction control logics 602, 606, 622, 628. The first, second, third and fourth direction control logics 602, 606, 622, 628 therefore decouple first inputs thereof from first outputs thereof and enable coupling between second inputs thereof and second outputs thereof. The scan enable control unit 434 then also operates in an opposite manner to that described above in relation to the order of setting the first scan enable output ($SE_{OR}$) 442 and the second scan enable output ($SE_{OT}$) 446. Likewise, clocking of the set of reference flip-flops and the target set of flip-flops via the first clock output ($CLK_R$) 454 and the second clock output ($CLK_T$) 458 is reversed.

In a further embodiment, one or more of the first, second, third and/or fourth direction control logics 602, 606, 622, 628 of the previous embodiment can be replaced by one or more respective multiplexers to fulfil the same function of the relevant direction control logic.

The skilled person should appreciate that whilst the above embodiments have been described in the context of flip-flops, the set of reference flip-flops can be any suitable set of reference stateful elements and the set of target flip-flops can be any suitable set of target stateful elements. For the avoidance of doubt, the skilled person should understand that the term "stateful" in relation to an element refers to a capability to assume a state.

Although in the above embodiments use of a logic scheme relying upon logic 0 or logic 1 level signals has been described in relation to operation of parts of the embodiments, the skilled person should appreciate that in other embodiments a converse logic scheme to that described can be employed.

It is thus possible to provide a processing resource apparatus and a method of synchronising a processing resource that takes advantage of scan lines necessary for testing purposes in order to enable synchronisation when needed between reference and target modules. The number of clock cycles required to achieve synchronisation is also significantly reduced and accessibility to stateful elements within the reference and target modules is improved. Additionally, the reference and target modules do not have to be reset to achieve synchronisation, thereby leaving the reference and target modules available to perform processing tasks. Furthermore, less die space is required and software overhead is reduced to achieve synchronisation. Of course, the above advantages are exemplary, and these or other advantages may be achieved by the invention. Further, the skilled person will appreciate that not all advantages stated above are necessarily achieved by embodiments described herein At least part of the invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or diskette, stored with data loadable in a memory of a computer system, the data representing the computer program. The data carrier may further be a data connection, such as a telephone cable or a wireless connection.

Some of the above embodiments, as applicable, may be implemented using a variety of different information processing systems. For example, although FIGS. 1, 2, 4 and 6 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of apparatus 100 are circuitry located on a single integrated circuit or within a same device. Alternatively, apparatus 100 may include any number of separate integrated circuits or separate devices interconnected with each other. For example, the reference module 102 may be located on a same integrated circuit as the target module 104 or on a separate integrated circuit or located within another peripheral or slave discretely separate from other elements of the apparatus 100 The reference and target modules 102, 104 may also be located on separate integrated circuits or devices. Also for example, the apparatus 100 or portions thereof may be soft or code representations of physical circuitry or of logical representations convertible into physical circuitry. As such, the apparatus 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of the apparatus 100, for example, from computer readable media or other media on other computer systems. Such computer readable media may be permanently, removably or remotely coupled to an information processing system such as the apparatus 200. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, the apparatus 100 is part of a computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A processing resource apparatus comprising:
   one or more processor cores;
   a scan chain comprising a first set of stateful elements and a second set of stateful elements;
   a reference processing module to perform a first data processing operation based on state information stored at the first set of stateful elements;
   a target processing module to perform a second data processing operation based upon state information stored at the second set of stateful elements;
   a synchronization circuit to perform a synchronization operation, in a synchronization mode, the synchronization circuit comprising an enable input, in response to the enable input being asserted the synchronization circuit selectively couples an output of the first set of stateful elements to a scan input of the first set of stateful elements and to a scan input of the second set of stateful elements, and counting circuitry to control clocking the scan chain a predetermined number of times to synchronize the state information stored at the second set to the state information stored at the first set, wherein the first and second data processing operations are synchronized in response to the state information stored at the first and second sets being synchronized; and a manufacturing testing circuit to perform a manufacturing test operation, in a testing mode, the manufacturing testing circuit comprising a test enable input, in response to the test enable input being asserted the manufacturing testing circuit selectively couples the scan input of the first set of stateful elements to a scan data input and couples the scan input of the second set of stateful elements to the scan data input.

2. The processing resource apparatus of claim 1, wherein the enable input is asserted in response to detecting a synchronized application to be performed.

3. The processing resource apparatus of claim 2, wherein the synchronized application is a handover of processing functions.

4. The processing resource apparatus of claim 1, wherein the synchronization circuit further comprises a direction input, and the synchronisation circuit selectively couples the output of the first set of stateful elements to the scan input of the first set of stateful elements and to the scan input of the second set of stateful elements, and the counting circuitry controls clocking the scan further in response to the direction input being negated; and in response to the enable signal being asserted and the direction input being asserted, the synchronization circuit is further to selectively couple an output of the second set of stateful elements to the scan input of the first set of stateful elements and to the scan input of the second set of stateful elements, and the counting circuitry controls clocking the scan chain the predetermined number of times to synchronize the state information stored at the first set to the state information stored at the second set.

5. A method, comprising:

performing, using one or more microprocessor cores, a first data processing operation in a reference processing module based on first state information stored at a first set of stateful elements of a scan chain;

performing a second data processing operation in a target processing module based on second state information stored at a second set of stateful elements of the scan chain;

in response to an enable input being asserted in a synchronization mode, coupling an output of the first set of stateful elements to a scan input of the first set of stateful elements and to a scan input of the second set of stateful elements, and clocking the scan chain a predetermined number of times to synchronize the second state information stored at the second set to the first state information stored at the first set;

wherein the first and second data processing operations are synchronized in response to the state information stored at the first and second sets being synchronized; and in response to a test enable input being asserted in a testing mode, coupling the scan input of the first set of stateful elements to a scan data input and couples the scan input of the second set of stateful elements to the scan data input.

6. The method of claim 5, further comprising:

asserting the enable input in response to detecting a synchronized application to be performed.

7. The method of claim 6, wherein the synchronized application is a handover of processing functions.

8. The method of claim 5, further comprising:

performing a manufacturing test operation using the scan chain.

9. The method of claim 5, further comprising:

in response to the enable input being asserted and to a direction input being asserted, coupling an output of the second set of stateful elements to the scan input of the first set of stateful elements and to the scan input of the second set of stateful elements; and clocking the scan chain a predetermined number of times to synchronize the second state information stored at the second set to the first state information stored at the first set.

10. A processing resource apparatus comprising:

a scan chain comprising a first set of stateful elements and a second set of stateful elements;

a reference processing module to perform a first data processing operation based on state information stored at the first set of stateful elements;

a target processing module to perform a second data processing operation based upon state information stored at the second set of stateful elements;

a synchronization circuit to perform a synchronization operation, the synchronization circuit comprising an enable input and a direction input, in response to the enable input being asserted and the direction input being negated the synchronization circuit selectively couples an output of the first set of stateful elements and to a scan input of the first set of stateful elements and to a scan input of the second set of stateful elements, and counting circuitry controls clocking the scan chain a predetermined number of times to synchronize the state information stored at the second set to the state information stored at the first set, and in response to the enable input being asserted and the direction input being asserted the synchronization circuit selectively couples an output of the second set of stateful elements and to the scan input of the second set of stateful elements and to the scan input of the first set of stateful elements, wherein counting circuitry controls clocking the scan chain a predetermined number of times to synchronize the state information stored at the first set to the state information stored at the second set, wherein the first and second data processing operations are synchronized in response to the state information stored at the first and second sets being synchronized.

11. The processing resource apparatus of claim 1, wherein the enable input is asserted in response to detecting a synchronized application to be performed.

12. The processing resource apparatus of claim 2, wherein the synchronized application is a handover of processing functions.

* * * * *